(12) United States Patent
Chen

(10) Patent No.: US 6,975,109 B2
(45) Date of Patent: *Dec. 13, 2005

(54) METHOD FOR FORMING A MAGNETIC SENSOR THAT USES A LORENTZ FORCE AND A PIEZOELECTRIC EFFECT

(75) Inventor: Bo Su Chen, Freeport, IL (US)

(73) Assignee: Honeywell International Inc., Morristown, NJ (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/207,299

(22) Filed: Jul. 29, 2002

(65) Prior Publication Data

US 2002/0190712 A1    Dec. 19, 2002

Related U.S. Application Data

(62) Division of application No. 09/653,835, filed on Sep. 1, 2000, now Pat. No. 6,426,621.

(51) Int. Cl.[7] ............................................. G01R 33/02
(52) U.S. Cl. .................. 324/244; 324/260; 427/457; 427/458
(58) Field of Search ................ 118/723 MA; 427/457, 427/458, 547; 324/244, 260

(56) References Cited

U.S. PATENT DOCUMENTS

| | | |
|---|---|---|
| 4,500,838 A | 2/1985 | Bloomer |
| 4,992,659 A | 2/1991 | Abraham et al. |
| 5,442,288 A | 8/1995 | Fenn et al. |
| 5,581,021 A * | 12/1996 | Flechsig et al. ............... 73/105 |
| 5,623,205 A | 4/1997 | Tomita et al. |
| 5,675,252 A | 10/1997 | Podney |
| 5,731,703 A | 3/1998 | Bernstein et al. |
| 5,739,686 A | 4/1998 | Naughton et al. |
| 5,872,372 A * | 2/1999 | Lee et al. ...................... 257/254 |
| 5,925,973 A * | 7/1999 | Eda et al. ...................... 310/348 |
| 6,609,785 B2 * | 8/2003 | Hashizume et al. .......... 347/70 |
| 6,693,516 B1 * | 2/2004 | Hayward .................. 340/407.1 |

FOREIGN PATENT DOCUMENTS

| | | |
|---|---|---|
| GB | 1279091 | 6/1972 |
| JP | 1-185463 | 7/1989 |

OTHER PUBLICATIONS

PCT International Search Report, Apr. 3, 2000, relative to Internstional Application No. PCT/US 99/14781, foreign counterpart of this application.

* cited by examiner

Primary Examiner—Parviz Hassanzadeh
Assistant Examiner—Sylvia R. MacArthur
(74) Attorney, Agent, or Firm—Kris T. Fredrick; Kermit D. Lopez; Luis M. Ortiz

(57) ABSTRACT

A method and apparatus for sensing a presence of a magnetic field and/or a magnitude of a magnetic flux density of the magnetic field. A direct-current voltage is applied across a first layer of a conductive material, so that a direct current flows in a first direction through the first layer. A second layer of a piezoelectric material is integrated with or positioned adjacent or abutting the first layer. The first layer and the second layer are exposed to or positioned within a magnetic field. A Lorentz force is thus caused, preferably in a direction which is generally perpendicular to the first direction of the direct current and a second direction of the magnetic field to deflect the piezoelectric material thereby causing an output voltage in response to the Lorentz force. A magnetic flux density can be calculated as a function of the piezoelectric output.

31 Claims, 1 Drawing Sheet

METHOD FOR FORMING A MAGNETIC SENSOR THAT USES A LORENTZ FORCE AND A PIEZOELECTRIC EFFECT

This application is a divisional application of application Ser. No. 09/653,835, filed on Sep. 1, 2000 now U.S. Pat. No. 6,426,621.

BACKGROUND OF THE INVENTION

1. Field of the Invention

This invention relates to a method and an apparatus for sensing a magnetic field and for detecting a magnetic flux density, each as a function of a measured Lorentz force.

2. Discussion of Related Art

Hall sensors have been used to sense magnetic fields. Hall effect transducers have been used with pole pieces and biasing magnets to increase sensitivity of the Hall sensors. When used with a magnet, a pole piece tends to channel a magnetic field and thus change flux densities in a magnetic circuit.

U.S. Pat. No. 4,992,659 discloses a microscopy apparatus for measuring Lorentz force-induced deflection of a tip of a scanning tunneling microscope to image magnetic structures of a sample. Motion of the tip, which indicates the presence of a magnetic field, is optically detected. The magnetic field measurement and a tip position are received by a computer which provides an output signal to a device for graphically representing the magnetic field at different positions on a surface of the sample.

U.S. Pat. No. 5,675,252 discloses a piezomagnetometer which uses a magnetoelectric composite structure, formed by alternating layers of piezoelectric and magnetostrictive material, to convert a fluctuating magnetic field directly to electric current. An ambient magnetic field strains magnetostrictive layers which stresses piezoelectric layers and drives a polarization current proportional to an amplitude of the magnetic field.

It is apparent that there is a need for a method and apparatus that enables a microelectronic structure to sense a magnetic field and to measure a magnetic flux density. There is also a need for a method and apparatus that produces a significantly higher output voltage, as compared to conventional methods and apparatuses, when exposed to the same magnetic field.

SUMMARY OF THE INVENTION

It is one object of this invention to provide a method and apparatus that uses a Lorentz force and a piezoelectric effect to detect the presence of a magnetic field and to measure a magnetic flux density of the magnetic field.

It is another object of this invention to provide a microelectronic structure that detects the presence of a magnetic field and measures a magnetic flux density of the magnetic field.

It is still another object of this invention to provide a method and apparatus that produces a significantly higher output voltage signal, as compared to known methods and apparatuses, when exposed to the same magnetic field.

The above and other objects of this invention are accomplished with a method for sensing a magnetic field wherein a direct-current voltage is applied across a first layer of a conductive material. A direct current flows in a first direction through the first layer. A second layer of piezoelectric material is either integrated with or is adhered to the first layer. The first layer and the second layer are positioned within or exposed to the magnetic field. A Lorentz force generated in a second direction, which is preferably but not necessarily generally perpendicular to the first direction, is generated causing the piezoelectric material to deflect. The presence of a magnetic field and/or a magnetic flux density of the magnetic field can be calculated as a function of the measured Lorentz force.

In one preferred embodiment according to this invention, the direct current is in a range of about 0.1 mA to about 10 mA, and preferably about 3 mA. Also in a preferred embodiment of this invention, a magnitude of the magnetic flux density is in a range of about 100 Gauss to about 1,000 Gauss, preferably about 400 Gauss.

The first layer of the conductive material and the second layer of the piezoelectric material can be moved within the magnetic field into a position where the magnitude of the Lorentz force is at a maximum value. In such position where the Lorentz force is at a maximum value, the two vectors representing the direct current and the magnetic field are at a right angle with respect to each other. The Lorentz force is generated in a direction which is preferably generally perpendicular to the directions of the vectors of the direct current and the magnetic field.

In one preferred embodiment according to this invention, an apparatus for sensing a magnetic field comprises the first layer of the conductive material integrated with, or applied to, the second layer of the piezoelectric material, such as by a sputtering technique or other suitable deposition technique. As the layer of piezoelectric material changes shape it produces a change in voltage. A sensor can then measure the Lorentz force generated by measuring the voltage. A computer is preferably used to receive the transducer output signal corresponding to the measured Lorentz force. The computer then calculates either the presence of a magnetic field or a magnitude of the magnetic flux density, as a function of the measured Lorentz force, using any suitable analog and/or digital circuit.

BRIEF DESCRIPTION OF THE DRAWINGS

The above-mentioned and other features and objects of this invention will be better understood from the following detailed description when taken in view of the drawings wherein.

DESCRIPTION OF PREFERRED EMBODIMENTS

Figure 1:
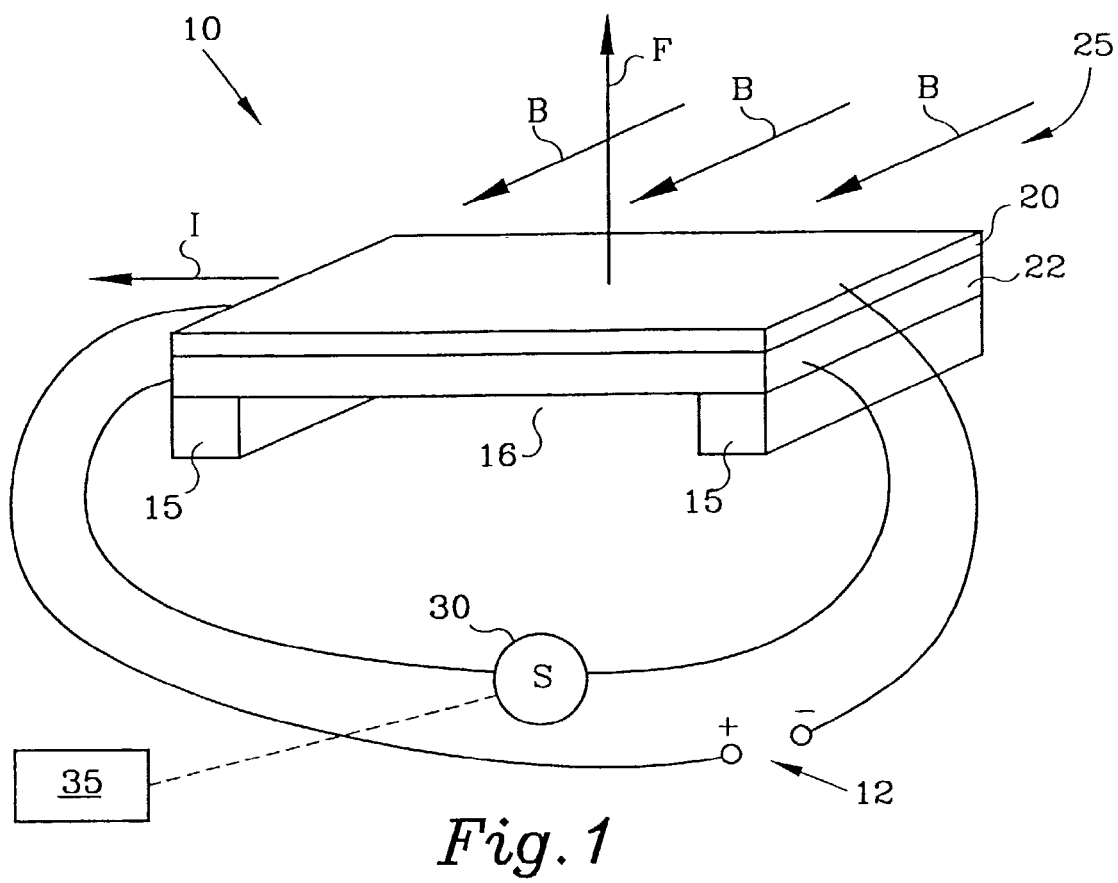
FIG. 1 is a perspective schematic diagram of an apparatus according to one preferred embodiment of this invention.

Apparatus 10, which is used to sense a presence of magnetic field 25 and/or to measure a magnetic flux density of magnetic field 25, comprises base 15, first layer 20 and second layer 22. The elements are preferably sized, shaped and otherwise designed so that apparatus 10 forms a microelectronic structure. Apparatus 10 and the corresponding method of this invention uses a combination of Lorentz force and piezoelectric effect to determine the presence of magnetic field 25 and/or to measure the magnetic flux density of magnetic field 25. In one preferred embodiment the magnetic flux density is in a selected range of about 100 Gauss to about 1000 Gauss. The physical size, layout and/or materials of the different elements of apparatus 10 can be modified according to the strength of magnetic field 25 and/or the desired output voltage from apparatus 10.

As shown in FIG. 1, second layer 22 spans two support surfaces of base 15, forming gap 16. Second layer 22 is preferably attached to, secured to or otherwise fixed to base 15 so that second layer 22 can deflect in a controlled or consistent fashion. Second layer 22 is constructed of a piezoelectric material, such as polyvinylidene fluoride, a copolymer of a polyvinylidene fluoride, or another suitable material that exhibits a change in voltage or electromotive force as a function of a change in shape. Piezoelectric materials suitable for use with this invention are known to those skilled in the art of microelectronic structures.

As shown in FIG. 1, second layer 22 spans or forms a bridge across the support surfaces of base 15. However, second layer 22 and base 15 can form any other suitable structure that accommodates or allows second layer 22 to deflect or change shape, such as when exposed to or introduced within magnetic field 25. Second layer 22 preferably but not necessarily has an overall strip shape, for example having a length in a range of about 1 mm to about 5 mm, a width in a range of about 0.05 mm to about 0.15 mm and a thickness in a range of about 0.001 mm to about 0.010 mm. Base 15 can have any suitable shape or structure that provides support for second layer 22 and that allows at least a portion of second layer 22 to deflect or otherwise change shape. For example, rather than a spanning beam, second layer 22 may form a cantilever structure having only one end fixed to base 15, wherein second layer 22 extends over gap 16. Base 15 preferably forms gap 16 over which second layer 22 spans.

Base 15 is preferably constructed of a dielectric material, such as silicon, a composite containing silicon, or any other suitable material that has non-conductive properties, as known to those skilled in the art of microelectronic structures. Base 15 can be etched or produced with any other suitable manufacturing processes, also as known to those skilled in the art of microelectronic structures.

First layer 20 is preferably constructed of a conductive material, such as copper, gold and/or aluminum. In one preferred embodiment according to this invention, first layer 20 is applied to second layer 22 using an electrical depositing method, such as a suitable sputtering technique as known to those skilled in the art of microelectronic structures. First layer 20 is positioned adjacent or abuts second layer 22 and thus preferably has similar dimensions to second layer 22.

Voltage source 12 is attached to or across first layer 20 so that a direct current passes through first layer 20, in a first direction. In one preferred embodiment according to this invention, the direct current is in a range of about 0.1 mA to about 100 mA, preferably about 3 mA. Voltage source 12 may comprise a battery or any other suitable direct-current voltage source known to those skilled in the art.

As shown in FIG. 1, sensor 30 is attached to or connected to second layer 22 so that sensor 30 measures a voltage output from the piezoelectric second layer 22 corresponding to Lorentz force F generated in a second direction. In one preferred embodiment of this invention, the second direction of the Lorentz force is generally perpendicular to the first direction of the direct current passing through first layer 20. Sensor 30 may also comprise an output for emitting an output signal which is proportional to a magnitude of the Lorentz force. It will be appreciated that Lorentz force F is maximal when the current and the magnetic field are perpendicular.

Apparatus 10 may also comprise computer means 35 for receiving the output signal and for calculating a presence of magnetic field 25 and/or a magnitude of and/or a direction of the magnetic flux density of magnetic field 25, preferably as a function of the measured Lorentz force. Computer means 35 may comprise any suitable hardware and/or software suitable for storing data and performing mathematic functions and/or algorithms. For example, an open-circuit output voltage (V) of second layer 22 can be calculated according to the following known equation:

$$V = g_{31}(F/wt)(t) = g_{31}(F/W)$$

where F is the magnitude of the Lorentz force, w is the width of second layer 22, t is the thickness of second layer 22, and $g_{31}$ is the piezoelectric coefficient mode of second layer 22. According to the above equation, with second layer 22 shaped as a beam with w=0.1 mm, the length (L)=3 mm, and with second layer 22 attached to base 15 at two locations and spanning gap 16, when exposed to magnetic field 25 having a magnetic flux density of 400 Gauss, the measured Lorentz force F is about $36 \times 10^{-6}$ Newton with a 0.8 mV piezoelectric output.

In one preferred embodiment according to this invention, the Lorentz force changes, such as by stretching, the shape of second layer 22. Because second layer 22 behaves as a strain gauge, a signal, such as the 0.8 mV signal, is generated. The 0.8 mV signal is much greater than signals generated from other conventional strain gauges that require further amplification to reach a magnitude similar to the magnitude achieved with apparatus 10 of this invention. For example, a conventional Hall sensor having a similar shape and dimensions would produce an output voltage of about $1.5 \times 10^{-6}$ mV when positioned within a magnetic field having the same magnetic flux density of 400 Gauss.

The Lorentz force F is also expressed according to the following equation:

$$F = (I \times B)L$$

where I is the direct current vector and B is the magnetic field vector. The Lorentz force F reaches a maximum value when the two vectors I and B are positioned at right angles with respect to each other. Thus in one preferred embodiment of this invention, apparatus 10 is positioned within magnetic field 25 so that the Lorentz force F is in the second direction which is generally perpendicular to the first direction of the direct current vector I and to the third direction of the magnetic field vector B.

Figure 2:
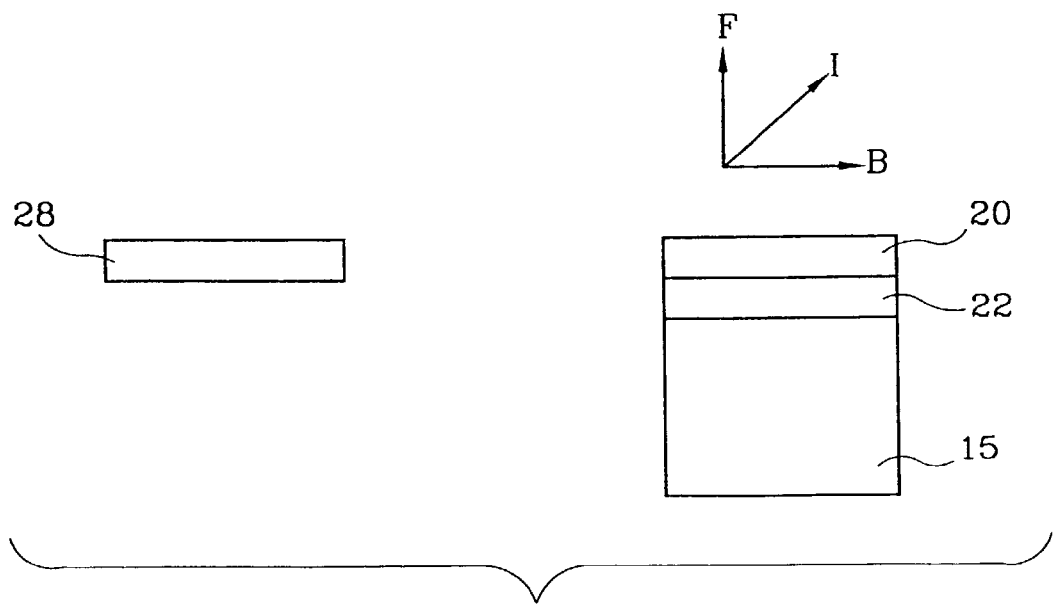
FIG. 2 is a schematic end view of a pole piece positioned near an apparatus, according to one preferred embodiment of this invention.

Referring to FIG. 2, in another preferred embodiment according to this invention, apparatus 10 further comprises pole piece 28 or a bias magnet. Pole piece 28 is used to alter magnetic field 25 of this invention in a fashion similar to how pole pieces are used in combination with conventional Hall sensors.

In one preferred embodiment of a method according to this invention, the direct-current voltage is applied across or to first layer 20 so that the direct current flows or passes through first layer 20, in the first direction. The direct-current voltage and/or the direct current can be measured and varied using meters, circuits and/or voltage devices which are known to persons skilled in the art of microelectronic sensors.

Second layer 22 is adhered and positioned adjacent, or abuts, or is integrated with first layer 20. First layer 20 and second layer 22 are positioned within or exposed to magnetic field 25. In one preferred embodiment, apparatus 10 can be moved or positioned to generate the maximal Lorentz force F by placing the first direction of the direct current perpendicular to the third direction of magnetic field 25. it will be appreciated that F is always perpendicular to the current direction and the magnetic field, and that the strength of F decreases as the perpendicular vector of current to magnetic field decreases.

The generated Lorentz force F deflects second layer 22 which outputs a voltage which is measured as an output signal and is preferably transmitted to computer means 35. The measured Lorentz force F can then be used to detect the presence of magnetic field 25 and/or to measure the magnitude of the magnetic flux density of magnetic field 25.

While in the foregoing specification this invention has been described in relation to certain preferred embodiments thereof, and many details have been set forth for purpose of illustration it will be apparent to those skilled in the art that the invention is susceptible to additional embodiments and that certain of the details described herein can be varied considerably without departing from the basic principles of the invention.

I claim:

1. A method for sensing a magnetic field, comprising:
   (a) providing a substrate;
   (b) etching the substrate to provide a gap;
   (c) forming a conductive layer extending at least partially over the gap;
   (d) forming a piezoelectric layer extending over the gap and positioned adjacent to the conductive layer;
   (e) applying a direct-current voltage across the conductive layer wherein a direct current flows in a first direction;
   (f) positioning the piezoelectric layer within a magnetic field and generating a Lorentz force in a second direction generally perpendicular to the first direction to deflect the piezoelectric layer;
   (g) emitting a signal output from the piezoelectric layer as a function of a generated Lorentz force; and
   (h) calculating a magnetic flux density of the magnetic field as a function of the voltage output of the piezoelectric layer as caused by the Lorentz force.

2. The method of claim 1 further comprising the step of forming the conductive layer and the piezoelectric layer by applying an electrical deposition technique.

3. The method of claim 2, wherein the electrical deposition technique is a sputtering technique.

4. The method of claim 1 further comprising the steps of forming the conductive layer as a first strip and forming the piezoelectric layer as a second strip that are substantially similar in size and shape.

5. The method of claim 1 further comprising the step of adhering the piezoelectric layer to the conductive layer.

6. The method of claim 1 further comprising the step of integrating the piezoelectric layer with the conductive layer.

7. The method of claim 1 further comprising the step of forming the piezoelectric layer of a material that can change shape to emit the output signal.

8. The method of claim 1, wherein the step of forming the piezoelectric layer comprises the step of forming the piezoelectric layer such that it can change shape when exposed to the Lorentz force.

9. The method of claim 1, wherein the piezoelectric layer is a polyvinylidene fluoride.

10. The method of claim 1, wherein the piezoelectric layer is a copolymer of a polyvinylidene fluoride.

11. The method of claim 1, wherein the step of etching the substrate comprises the step of etching the substrate to form at least two support surfaces to form the gap and wherein the step of forming the piezoelectric layer comprises the step of forming the piezoelectric layer as a bridge across the gap formed by the at least two support surfaces.

12. The method of claim 1, wherein the step of etching the substrate comprises the step of etching the substrate to form at least two support surfaces to form the gap and wherein the step of forming the piezoelectric layer comprises the step of forming the piezoelectric layer as a cantilever structure with at least one end of the piezoelectric layer attached to at least one of the at least two support surfaces.

13. The method of claim 1 further comprising the step of providing a pole piece in communication with the first layer and the second layer.

14. The method of claim 1, further comprising the step of providing the signal to a computer and calculating a magnitude of a magnetic flux density as a function of the Lorentz force.

15. The method of claim 14, further comprising the step of providing the signal to a computer and calculating whether the magnetic field is present.

16. A method for forming a magnetic sensor, comprising the steps of:
   providing a substrate;
   etching the substrate to provide at least one support surface;
   forming a second layer spanning at least a portion of the substrate having the at least one support surface such that at least a portion of the second layer is deflectable; and forming a first layer adjacent the second layer;
   applying a direct-current voltage across the first layer wherein a direct current flows in a first direction:
   positioning the second layer within a magnetic field and generating a Lorentz force in a second direction generally perpendicular to the first direction to deflect the second layer;
   emitting a signal output from the second layer as a function of a generated Lorentz force; and
   calculating a magnetic flux density of the magnetic field as a function of the voltage output of the second layer as caused by the Lorentz force.

17. The method of claim 16, wherein the first layer is a conductive layer.

18. The method of claim 17 further comprising the step of providing a voltage source to the conductive layer.

19. The method of claim 16, wherein the second layer is a piezoelectric layer.

20. The method of claim 19, wherein the step of forming the piezoelectric layer comprises the step of forming the piezoelectric layer such that it can change shape when exposed to the Lorentz force.

21. The method of claim 19 further comprising the step of adhering the piezoelectric layer to the conductive layer.

22. The method of claim 19 further comprising the step of integrating the piezoelectric layer with the conductive layer.

23. The method of claim 19, wherein the piezoelectric layer is a material that can change shape to produce a change in voltage.

24. The method of claim 16, wherein the step of providing for an output comprises the step of providing the output to a computer and calculating a magnitude of the magnetic flux density as a function of the Lorentz force.

25. The method of claim 16, wherein the step of providing for an output comprises the step of providing the output to a computer and calculating whether the magnetic field is present.

26. The method of claim 16, wherein the substrate is a material that is non-conductive.

27. The method of claim 16, wherein the substrate is a dielectric material.

28. The method of claim 16 further comprising the step of providing a sensor in communication with the second layer to measure the output.

29. The method of claim 16 further comprising the step of providing a pole piece in communication with the first layer and the second layer.

30. The method of claim 16, wherein the step of etching the substrate comprises the step of etching the substrate to form at least two support surfaces and wherein the step of forming the second layer comprises the step of forming the second layer as a bridge across the at least two support surfaces.

31. The method of claim 16, wherein the step of etching the substrate comprises the step of etching the substrate to form at least two support surfaces and wherein the step of forming the second layer comprises the step of forming the second layer as a cantilever structure with at least one end of the second layer attached to at least one of the at least two support surfaces.

* * * * *